United States Patent [19]

Nishizawa

[11] Patent Number: 4,692,194
[45] Date of Patent: Sep. 8, 1987

[54] METHOD OF PERFORMING SOLUTION GROWTH OF A GAAS COMPOUND SEMICONDUCTOR CRYSTAL LAYER UNDER CONTROL OF CONDUCTIVITY TYPE THEREOF

[75] Inventor: Jun-ichi Nishizawa, Sendai, Japan

[73] Assignee: Zaidan Hojin Handotai Kenkyu Shinkokai, Sendai, Japan

[21] Appl. No.: 904,759

[22] Filed: Sep. 25, 1986

Related U.S. Application Data

[63] Continuation-in-part of Ser. No. 729,054, Apr. 30, 1985, abandoned, which is a continuation-in-part of Ser. No. 473,675, Mar. 8, 1983, abandoned.

[30] Foreign Application Priority Data

Mar. 9, 1982 [JP] Japan .................................. 57-37526

[51] Int. Cl.[4] .......................................... H01L 21/208
[52] U.S. Cl. ..................................... 437/120; 156/624
[58] Field of Search ...................... 148/171, 172, 173;
156/624; 29/576 E

[56] References Cited

U.S. PATENT DOCUMENTS

| | | | |
|---|---|---|---|
| 3,676,228 | 7/1972 | Sakurai et al. | 148/173 X |
| 3,705,825 | 12/1972 | Touchy et al. | 148/173 X |
| 4,035,205 | 7/1977 | Lebailley et al. | 148/33 X |
| 4,384,398 | 5/1983 | Dutt | 148/171 X |

OTHER PUBLICATIONS

Nishizawa et al., *J. Appl. Phys.* vol. 44, No. 4, Apr. 1973, pp. 1638–1645.
Nishizawa et al., *J. Crystal Growth*, vol. 31 (1975), pp. 215–222.

*Primary Examiner*—George T. Ozaki
*Attorney, Agent, or Firm*—Cushman, Darby & Cushman

[57] ABSTRACT

In a solution growth method to perform an epitaxial growth by doping an amphoteric impurity into a Group III–V compound semiconductor crystal, vapor of a crystal-constituting Group V element is supplied to the solution, during the growth process, from above this solution under a controlled vapor pressure, while maintaining the growth temperature at a constant value by relying on, for example, a temperature difference technique, whereby the conductivity type in the grown crystal layer can be controlled easily as desired, and also a pn junction can be conveniently formed in the grown crystal.

4 Claims, 9 Drawing Figures

METHOD OF PERFORMING SOLUTION GROWTH OF A GAAS COMPOUND SEMICONDUCTOR CRYSTAL LAYER UNDER CONTROL OF CONDUCTIVITY TYPE THEREOF

CROSS REFERENCE TO RELATED APPLICATIONS

This is a continuation-in-part of application Ser. No. 729,054, filed Apr. 30, 1985, which was abandoned upon the filing hereof, and which is a continuation-in-part of my earlier application Ser. No. 473,675 filed Mar. 8, 1983, now abandoned.

BACKGROUND OF THE INVENTION

1. Field of the Invention

The present invention relates generally to a method of growing a Group III-V compound semiconductor crystal layer such as GaAs from a solution, and more particularly it pertains to a method of doing so while controlling the conductivity type of the grown crystal layer as desired. Still more particularly, the present invention concerns a method of solution growth of a compound semiconductor crystal layer as mentioned above which uses a melt, serving as the solution, in which a Group IV element is doped as an impurity atom source for determining the conductivity type of the grown layer and by relying on the temperature difference technique while controlling the vapor pressure of the Group V element which constitutes said compound.

2. Description of the Prior Art

When a semiconductor device is manufactured, on a substrate, by the epitaxial growth of a III-V compound semiconductor crystal, which is typically GaAs, the manufacturing procedure relies primarily upon a solution growth method. The solution growth method, which has been generally employed conventionally for the growth of Group III-V compound semiconductors, is the so-called Nelson method which has been developed by RCA Corporation of the U.S.A. The Nelson method includes the steps of dipping a substrate crystal in a melt, which has been prepared using an appropriate metal as a solvent, and dissolving a Group III-V compound semiconductor crystal together with atoms of a required impurity type in the solvent. The resulting solution is slowly cooled thereby causing recrystallization of the supersaturating Group III-V compound semiconductor on the substrate. In this procedure crystal growth is conducted through a cooling process. Accordingly, the growth temperature varies in the thickness direction of the layer which is grown. Thus, this known method has the drawbacks that the amount of the impurity serving as the dopant would change with a decrease in the temperature, and that, in case of a mixed crystal, the composition of the crystal will change as well.

A typical example of this procedure is represented by the relationship between the growth temperature and the conductivity type of GaAs doped with Si, an amphoteric impurity which may produce an n type and a p type conductivity. When an Si-doped GaAs is grown relying on the conventional slow-cooling Nelson method mentioned above, the crystal grown at the high temperature zone will exhibit an n type conductivity, and the conductivity becomes lower as the growing temperature is lowered. When, via a high resistivity region, the temperature is lowered to a further extent, the conductivity type converts so that the crystal will now exhibit a p type conductivity. A method of forming a p-n junction in a single growth process by positively utilizing this phenomenon of conversion has been proposed. However, the presence of this phenomenon also serves to demonstrate that the grown layer obtained by this slow-cooling method is not uniform in its body.

The reason why the conversion of the conductivity type takes place has been attributed to the fact that, at a high temperature, atoms of Si easily enter substitutionally into the lattice sites of Ga atoms providing an n type conductivity, and that, at a low temperature, Si atoms easily enter substitutionally into the lattice sites of As atoms to thereby exhibit a p type conductivity.

Accordingly, this conventional pn junction forming method utilizing the different patterns of substitution of an amphoteric impurity such as Si into the lattice sites of a Group III-V compound semiconductor crystal, especially owing to the fact that the drawbacks of the so-called Nelson method of making a non-uniform crystal are positively made use of, will naturally develop poor crystal perfection, and the fluctuation of, for example, the cooling rate intensively affects the crystallographic quality of the layer which is grown. Thus, even when atoms of an amphoteric impurity are introduced as a dopant into a melt, there actually has not been carried out such an ideal lattice substitution that the impurity atoms enter successfully into the desired lattice sites.

SUMMARY OF THE INVENTION

It is, therefore, the object of the present invention to provide an improved solution growth method for preparing Group III-V compound semiconductors, which eliminates the drawbacks of the prior art solution growth methods as mentioned above, and which enables one to obtain a grown crystal layer having uniform crystal characteristics in the growth direction, and also which gives rise to a p-n conversion phenomenon in an ideal fashion.

DETAILED DESCRIPTION OF THE PREFERRED EMBODIMENT

Figure 1:
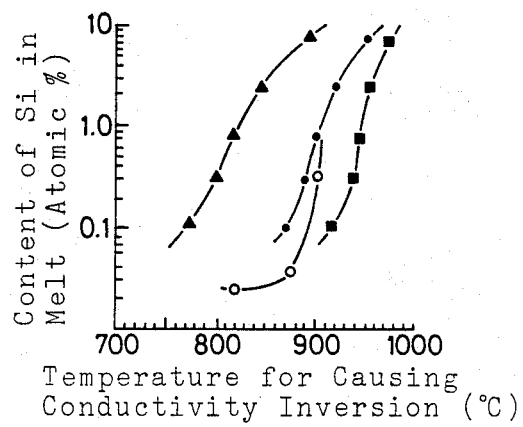
FIG. 1 is a graph showing the result of an experiment which indicates the relationship between the growth temperature and the amount of Si atoms contained in a melt, which are factors important in the conversion of the conductivity type from the n type to the p type when Si is doped in a GaAs crystal.

FIG. 1 is a graph showing the relationship between the growth temperature at which the n type-to-p type conversion takes place and the Si content in the melt when a solution growth is conducted by relying on the conventional solution growth method.

In FIG. 1, mark ● (solid circle) indicates the relationship for the (100) face of the substrate crystal, and mark ■ (solid square) for the (111)A face, and mark △ (solid triangle) for the (111)B face. However, the conversion temperature when the growth is performed on the (100) face by the present invention is shown also at mark (open circle).

As will be noted from this result, the conversion temperature changes even with surface orientation.

Figure 2:
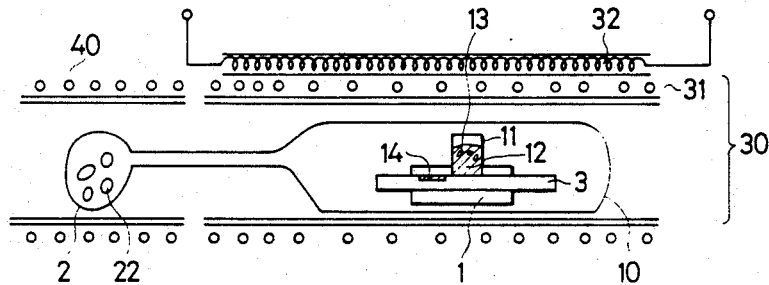
FIG. 2 is an explanatory sectional illustration showing an example of the arrangement of a solution growth apparatus which is employed in the present invention and which adopts both the vapor pressure control technique and the temperature difference technique.

The solution growth apparatus employed in the present invention is one relying on the temperature difference technique under controlled vapor pressure which has been proposed earlier by the present inventor. Its schematic illustration is shown in FIG. 2.

Various arrangements of reactor system can be conceived such as the open tube type and the closed tube system. Therefore, it is needless to say that the arrangement of the solution growth apparatus is not limited to that shown here. In case of a solution growth of, for example, a GaAs crystal, the growth apparatus is not limited to that shown here. In case of a solution growth of, for example, a GaAs crystal, the growth apparatus is provided with a growth boat 1 made of graphite, and a melt reservoir 11 containing therein a Ga melt 12 which, in turn, contains a required amount of Si, and on which is floated a GaAs crystal 13 which serves as the source crystal for the growth. A substrate crystal 14 is set in a recess formed in a slider 3. A chamber 2 which is formed within a quartz ampule 10 is provided in a separate temperature zone to apply, during the growth process, a constant vapor pressure of As which is a crystal-constituent element having a higher vapor pressure over the other constituent element Ga. This chamber 2 is connected, by a thin quartz tube, to the region where the growth boat is provided, for communication therewith. A metal As 22 is placed within this chamber 2. A growth furnace 30 is provided with a main heating means 31 for elevating the temperature of the whole apparatus, and also with a sub-heating means 32 intended for keeping only the upper portion of the growth boat at a high temperature. By these two heating means, the growth temperature and the temperature difference are set. Also, the vapor pressure of As which is introduced during the growth process is controlled by a vapor pressure control furnace 40 which is a unit separate from the growth furnace 30, and the vapor pressure which is applied is determined by the temperature of the As-containing chamber 2.

In the growing principle of the vapor pressure controlled temperature difference method, a crystal will be deposited by the temperature difference formed between the source crystal arranged on the solution and the crystal depositing part on the base plate crystal. Thus, as the temperature of the source crystal part is higher and therefore the dissolved amount of the solute in the solvent (Ga) is larger than in the crystal depositing part at a low temperature, a density gradient will be produced and the density will be diffused. Also, a flow of heat caused by the temperature difference will be produced in the same direction and the heat will be diffused. Therefore, it is evident that the growth rate of the epitaxial layer will increase in proportion to the temperature difference. Then, in the effect of the vapor pressure applied from the solution, as the source crystal larger than the saturated dissolved amount is arranged on the solution, the applied vapor pressure will not be capable of becoming a crystal growing source, but will control the deviation from the stoichiometric composition of the deposit crystal only slightly, for example, by about 1 ppm., varying the solubility of the solute in the solvent and therefore will not effect the growth rate.

It will be evident that if the growing temperature difference and growing time are set to be respectively the same, the thicknesses of the obtained epitaxial growth layer will be substantially identical irrespective of the applied vapor pressure. The relationship between the temperature difference and growing rate is described in detail in J. Crystal Growth, 31 P. 215 (1975). Also in the present invention, when the temperature difference of about 20° C. mentioned in that publication on page 216 in line 3 of the right-hand column is produced, the growing rate of about 5 μm/hr shown in line 16 of page 217 is obtained and the growth is performed for 5–6 hours. Accordingly, the thickness of the growth layers obtained with relation to respective As pressures will be almost the same.

A crystal is grown at a constant temperature, constant temperature difference as well as constant temperature of the As chamber. The growth is started by moving the slider 3 on the boat 1 and by contacting the melt and the substrate. Under these conditions the Ga atoms and the As atoms in the melt move from the high temperature zone toward the low temperature zone to recrystallize. After a growth period lasting for a predetermined length of time, slider 3 is moved again to cause separation of the substrate from the melt, and the temperature of the growth furnace is lowered.

The shape of Si which is introduced into the Ga melt may be in the form of Si crystal, or Ga and Si solution may be used in which Si is dissolved in Ga.

According to the growth performed by relying on the above said method, it is possible to obtain a grown layer with a high crystallographic quality because the deviation from the stoichiometric composition can be minimized owing to the fact that the crystal growth is performed at a completely constant temperature and that the vapor pressure is controlled.

Si, which is an amphoteric impurity, is added to the solution and the crystal growth is performed using the growth system mentioned above. The crystals grown at lower pressures should have a higher concentration of As vacancies and Si atoms replacing the As lattice site which are expected to act as an acceptor or vice versa. Therefore, the Si-doped GaAs crystals will be converted from p-type or n-type when the vapor pressure under which the melt was placed to segregate the crystal at the other end is increased.

In the case the added amphoteric impurity is Si, there is obtained a result which is very effective for the conversion of the conductivity type without damaging the perfection of the crystal grown, by using the solution growth apparatus mentioned above.

It is, therefore, the object of the present invention to provide a method for attaining the above-mentioned result. The method of the present invention is described below in further detail with respect to the preferred embodiment thereof.

EXAMPLE 1

Figure 3:
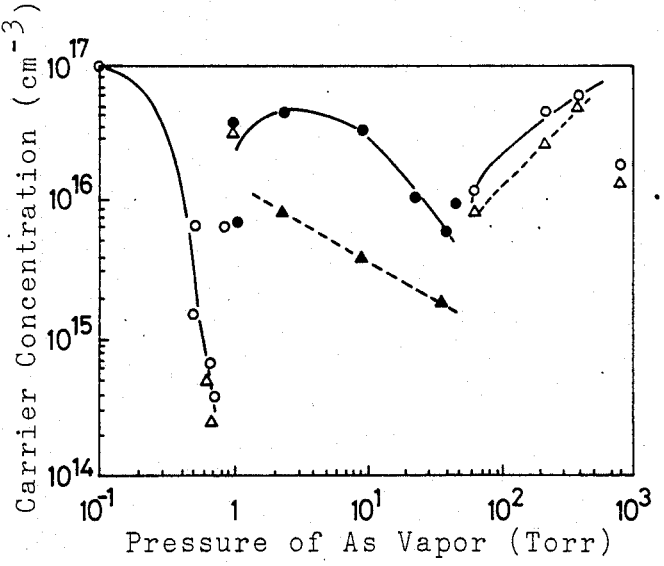
FIG. 3 is a graph showing the dependency of the carrier concentration upon the vapor pressure of As in a Si-doped GaAs crystal in the solution growth method of the present invention, wherein $Si/Ga = 3 \times 10^{-3}$ weight %.

FIG. 3 shows the dependency of carrier density upon the As vapor pressure.

Under a constant growth temperature of 820° C. and a constant amount of Si ($3 \times 10^{-3}$ weight %) into a Ga melt, by varying the As vapor pressure which is applied, an epitaxial growth was conducted on a highly resistive substrate. In FIG. 3, mark ○ indicates the n type, and mark ■ indicates the p type when the measurement was performed at 300° K. Mark △ indicates the n type, and mark ▲ indicates the p type when the measurement was carried out at 77° K. As indicated, there was no instance in which a change of substitution by the amphoteric impurity such as Si was noted at lattice sites due to the applied As vapor pressure. The result shows that the growth temperature was constant, and that a crystal growth was conducted in an ideal condition. FIG. 3 shows that, in the region in which the As vapor pressure was lower than 1 Torr, n type conductivity was exhibited, whereas in the region in which the As vapor pressure was in the range 1 to 55 Torr, the p type was exhibited, and that in the As pressure region above 55 Torr, n type conductivity was exhibited.

More specifically, at the As pressure of 55 Torr, the carrier concentration becomes a minimum, and the fact that the conductivity type alters at such condition signifies, as will be apparent also from the result of the other research done by the present inventor, that the value of this vapor pressure corresponds to such an As pressure at which the deviation of the crystal from the stoichiometric composition becomes a minimum. In the region wherein the As vapor pressure is lower than the region mentioned just above, As vacancies are easily introduced, causing the lattice sites of As to be substituted by Si, so that the p type conductivity is exhibited. Above 55 Torr, the Si substitutes the Ga lattice sites and shows the n type; this can be explained without contradiction even when compared with the results of other experiments. It is, however, not possible to explain, at present, that the carrier concentration becomes minimum in the vicinity of 1 Torr in FIG. 3.

Figure 4:
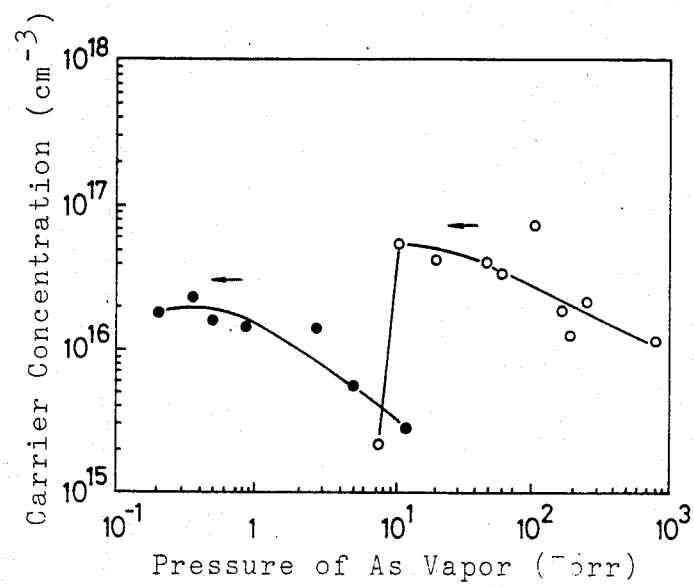
FIG. 4 is a graph showing a similar dependency as mentioned above, wherein $Si/Ga = 9.1 \times 10^{-3}$ weight %.

FIG. 4 shows the results of measurements of the crystal obtained by increasing the weight % content of Si in the Ga melt to $9.1 \times 10^{-3}$ weight %, with the other conditions being the same as those of FIG. 3. It will be noted that the As pressure for the conversion from the p type to the n type is in the vicinity of 7 Torr. It is apparent that, with an increase in the density of Si in the Ga melt, the As vapor pressure at which the conductivity type undergoes a conversion moves toward the lower pressure side. In the drawing, mark ○ indicates the n type, and mark ■ indicates the p type.

Figure 5:
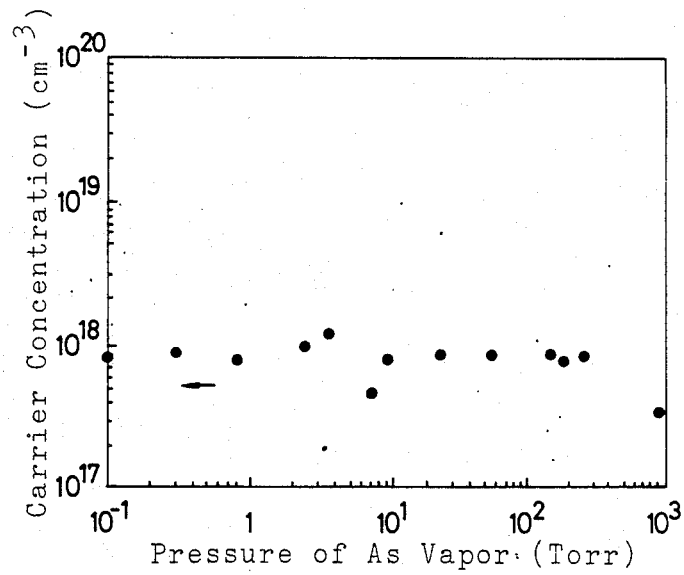
FIG. 5 is a graph showing similar dependency as mentioned above, wherein $Si/Ga = 1.1 \times 10^{-1}$ weight %.

The result of the measurement done when the ratio by weight % of Si is increased to $1.1 \times 10^{-1}$ weight % is shown in FIG. 5. In this case, unlike the preceding example, the p type conductivity is exhibited throughout the entire ranges of As vapor pressures under which the growth was conducted. In these As pressure ranges, no conversion phenomenon to the n type was observed. However, precisely speaking, as the range of these As pressures with which the experiments were conducted, they are, in fact, the pressures which block the growth of crystal owning to dissociation of the melt on the lower As pressure side, and it is impossible to perform a growth at an As vapor pressure lower than the lower pressure side. On the other hand, the higher pressure side experimented has to stand on the consideration of the limit of mechanical strength of the quartz ampule. A conversion phenomenon might be observed in an As pressure region outside this range, but in such an As pressure region, there will be exhibited a pattern different from the results shown in FIGS. 3 and 4.

Figure 6:
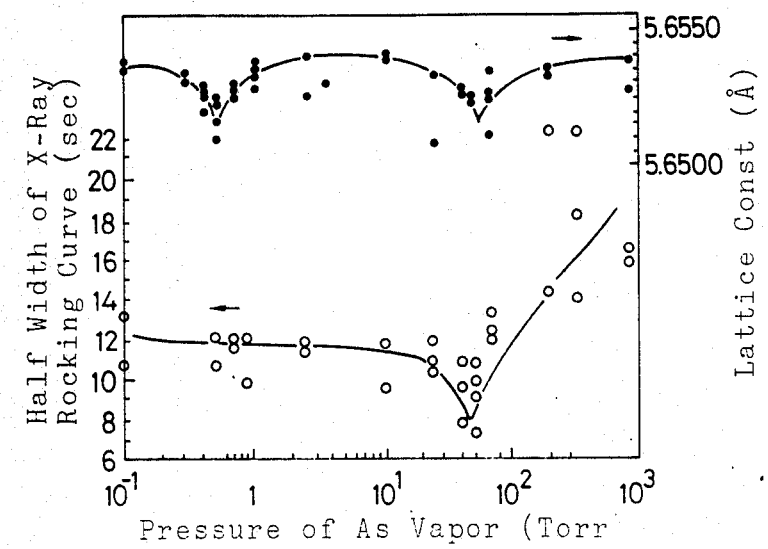
FIG. 6 is a graph showing the relationship between the vapor pressure of As (which is obtained from X-ray rocking curve, the lattice constant of the half width where $Si/Ga = 3 \times 10^{-3}$ weight %).
Figure 7:
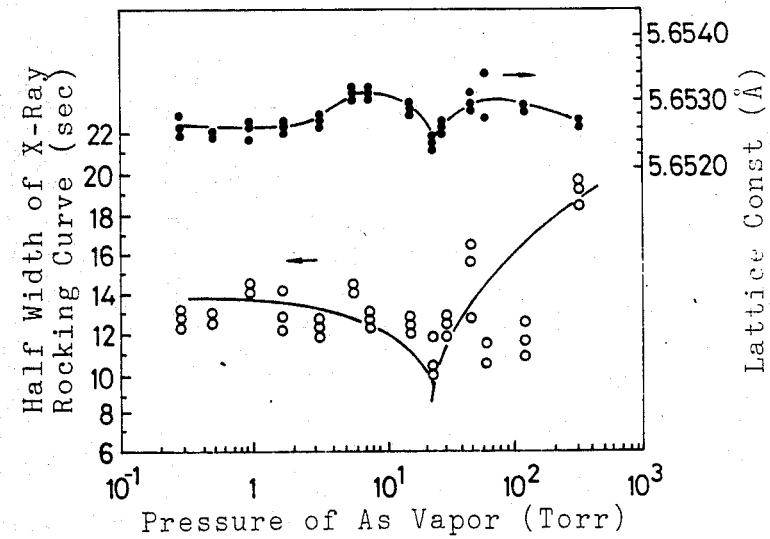
FIG. 7 is a graph showing similar relationship, wherein Si/Ga=9.1×10$^{-3}$ weight %.
Figure 8:
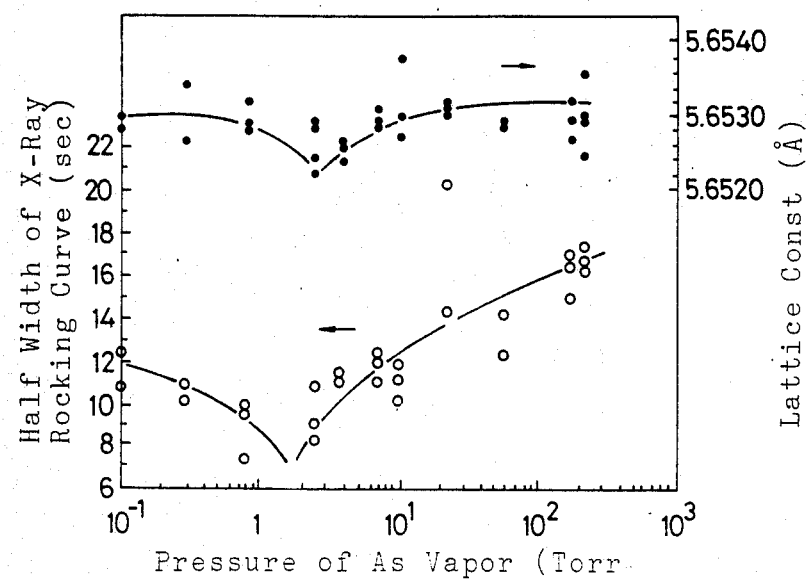
FIG. 8 is a graph showing similar relationship, wherein Si/Ga=1.1×10$^{-1}$ weight %.

Next, for the respective doping amounts of Si, X-ray analysis was used to examine the crystallinity of the doped grown layer, to thereby cause the respective crystals to depict their rocking curves, respectively. FIGS. 6 to 8 show the instances in which the lattice constant and the half width of the rocking curve which are observed from the X-ray examination are plotted against the applied As pressures.

Minimum values of lattice constant and half width are observed in each of the densities of Si introduced into the respective batches of melt. When the minimum amount of Si is introduced into the melt, i.e. $3 \times 10^{-3}$ weight %, shown in FIG. 6, both the lattice constant and the half width values showed the minimum at 50 Torr. This is substantially equal to the As pressure which causes p to n type conversion shown in FIG. 3.

In FIG. 7 on page 220 of J. Crystal Growth, 31 (1975) published by the present inventor and others, the stoichiometry line of GaAs is shown and the As pressure in a GaAs liquid phase growth temperature region corresponds to the range of $10^1$–$10^2$ Torr. Therefore, for the lattice substitution phenomenon caused by the stoichiometry control of the present invention, the growth attained at 1 Torr in the range of less than 10 Torr seems to have been performed by other phenomenon, which is excluded from the object of the present invention. In case the amount of Si added is increased further to $9.1 \times 10^{-3}$ weight % as shown in FIG. 7, the As pressure at which minimum values were observed are in the vicinity of 20 Torr which represents values of As pressures higher than the values at which p to n type conversion takes place in FIG. 4. Furthermore, in case of $1.1 \times 10^{-1}$ weight % shown in FIG. 8, minimum values of lattice constant and half width were noted in the vicinity of about 2 Torr of As vapor pressure.

The present inventor previously examined the crystallographic characteristic of GaAs crystals grown by the application of an As pressure during the solution growth, and has made clear that, when the lattice constant and the half width of the rocking curve become minimum, the crystallinity of the grown crystal is the best.

The results described above show the fact that the As vapor pressure for minimizing the deviation of the crystal from the stoichiometric composition depending on the amount of Si introduced differs from the As vapor pressure which causes a conversion of the conductivity type from the p type to the n type. More specifically, in case the amount of Si which is introduced is small, the As pressure at which the deviation from the stoichiometric composition of the grown crystal becomes minimum is in substantial agreement with the As pressure which causes the conductivity type converting phenomenon. However, it has become clear that, with an increase in the amount of Si which is introduced, the difference in the pressures of these two becomes greater.

Figure 9:
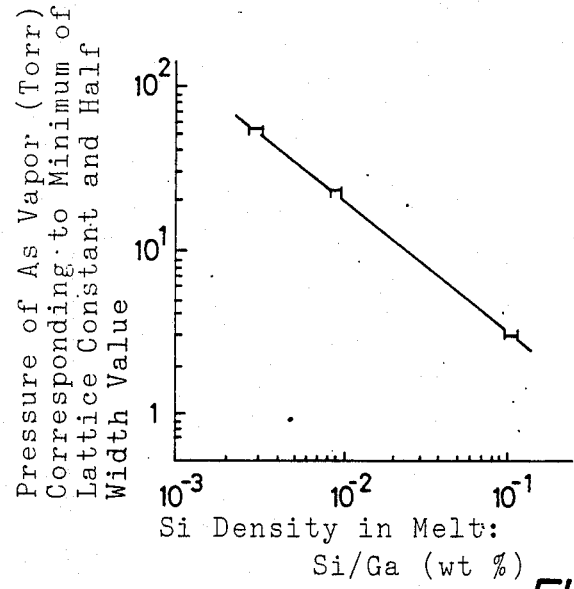
FIG. 9 is a graph showing the relationship between the density of dopant Si/Ga and the As vapor pressure $P_{As}$ min. where the lattice constant as well as the rocking curve half width are minimum.

The relationship between this amount of Si which is introduced, i.e. Si/Ga (weight %), and the As pressure value $P_{As\ min.}$ at which both the lattice constant and the half width of the rocking curve become minimum, is shown in FIG. 9. From this, it has been found that there is the following relationship: $P_{As\ min.} \propto W(Si/Ga)^{-1}$.

The relation between this relationship and the As pressure (Torr) which is the boundary between the p type and the n type with respect to Si (weight %) in each Ga can be expressed by $$\log P_{As} (Torr) = -0.8 \log (Si/Ga) - 0.3$$

That is to say, the n type growth layer will be formed in a region having higher pressures compared with this As pressure and, in a region having lower pressures, the p type growth layer will be formed. If these are generally formulated, the n type crystal and the p type crystal will be formed in the regions of $$\log P_{As} \geqq -0.8 \log (Si/Ga) - 0.3$$

and, $$\log P_{As} \leqq -0.8 \log (Si/Ga) - 0.3$$

respectively.

As has been discussed above, in the solution growth of a Group III-V compound semiconductor crystal, such as a GaAs crystal, the art of causing a conversion of the conductivity type of the crystal by doping, into the melt, an amphoteric impurity such as Si is one which makes use of the phenomenon which arises during the cooling process of the conventional Nelson method (slow cooling method), and in the past such growth has been performed conventionally in the circumstance in which the crystal perfection is poor and in which the crystal perfection cannot be controlled. In complete contrast to these prior procedures, the present invention makes use of the finding that, even in the solution growth for causing the growth of a crystal at a constant temperature relying on the temperature difference technique, the phenomenon of converting the conductivity type of the grown layer can be developed. Furthermore, by controlling the vapor pressure of the constituent element which is introduced to the melt and has a higher vapor pressure, both the conductivity (carrier concentration) and the conductivity type converting phenomenon, i.e. the substitution of the lattice sites by the amphoteric impurity, can be controlled under the best condition of the crystallinity. The present invention provides a method of such control.

The above-mentioned method of the present invention is not limited to the instance in which Si is added to GaAs, which is the example case described above. A similar phenomenon may be noted when any other Group IV element is added to any other Group III-V compound semiconductor. In any case, it should be noted that the present invention has made it possible for the first time to provide the method, in performing a solution growth at a constant growth temperature, to control the deviation from the stoichiometric composition of the grown crystal layer by controlling the vapor pressure of the crystal-constituting Group V element such as As which is supplied onto the melt from above and which has a higher vapor pressure over the other constituting element. In this way, the solubility of the solute in the melt is varied, and the lattice sites of atomic substitution (i.e. either the site of lattice on the Ga side or that on the As side) by a Group IVb amphoteric element such as Si are controlled.

What is claimed is:

1. A method of epitaxially growing a GaAs crystal layer on a GaAs substrate using a solution growth method which controls the conductivity type of the GaAs crystal layer being grown from a solution comprising a Ga melt as the solvent and a GaAs source crystal as a solute, said method comprising the steps of;
   (a) conducting an epitaxial growing process using a solution growth method to control the conductivity type of the GaAs crystal layer being grown at constant temperature and temperature difference, the crystal layer being grown from a solution comprising a Ga Melt as the solvent and a GaAs source crystal as a solute;
   (b) introducing into said solution an amount of amphoteric element Si to serve as an impurity for determining the conductivity type of the GaAs layer; and
   (c) supplying, throughout the growth process, As vapor onto the surface of said solution contacting said GaAs substrate on which said crystal layer is to be grown, while controlling the pressure of said As vapor in the range of:

$$P_{As1} = \log P_{As} > -0.8 \log (Si/Ga) - 0.3 \text{ for n-type,}$$

and $$P_{As2} = \log P_{As} < -0.8 \log (Si/Ga) - 0.3 \text{ for p-type}$$

where $P_{As}$ is expressed in Torr and Si/Ga in weight % and Si/Ga is $\leqq 1 \times 10^{-1}$ weight %, thereby forming an epitaxial GaAs crystal layer on a GaAs substrate.

2. A solution growth method according to claim 1, in which said crystal layer to be grown is a mixed crystal layer consisting of GaAs crystal and another Group III-V compound semiconductor crystal.

3. A solution growth method according to claim 1 in which the pressure of the As vapor which is applied is controlled to be at a value between 1 Torr and $10^3$ Torr.

4. A solution growth method according to claim 1, in which the vapor pressure of the As which is applied in step (c) is varied from $P_{As1}$ to $P_{As2}$ or $P_{As2}$ to $P_{As1}$ during the growth process to thereby vary said conductivity type in the crystal layer being grown.

* * * * *